(12) United States Patent
Uchida

(10) Patent No.: US 6,903,807 B2
(45) Date of Patent: Jun. 7, 2005

(54) STAGE APPARATUS AND ITS DRIVING METHOD, EXPOSURE APPARATUS AND DEVICE MANUFACTURING METHOD

(75) Inventor: Shinji Uchida, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 75 days.

(21) Appl. No.: 10/645,579

(22) Filed: Aug. 22, 2003

(65) Prior Publication Data

US 2004/0201834 A1 Oct. 14, 2004

(30) Foreign Application Priority Data

Aug. 29, 2002 (JP) ........................................ 2002-251449

(51) Int. Cl.$^7$ ..................... G03B 27/32; G03B 27/42; G03B 27/58; H02K 41/00
(52) U.S. Cl. ..................... 355/72; 355/53; 355/77; 310/12
(58) Field of Search .............................. 355/53, 72, 75, 355/77

(56) References Cited

U.S. PATENT DOCUMENTS 6,548,920 B2 * 4/2003 Joong et al. ................. 310/12

2002/0117903 A1   8/2002 Uchida ......................... 310/12
2004/0150269 A1 * 8/2004 Maki et al. ................... 310/12

FOREIGN PATENT DOCUMENTS

JP          11-194824         7/1999

* cited by examiner

*Primary Examiner*—Rodney Fuller
(74) *Attorney, Agent, or Firm*—Fitzpatrick, Cella, Harper & Scinto

(57) ABSTRACT

A stage apparatus including a center slider movable in XY directions and a substrate stage mounted on the center slider. The center slider and the substrate stage are connected by plural electromagnet units to generate a moving force in a predetermined direction to the substrate stage by application of electric current to exciting coils. A moving force to be applied to the substrate stage and its direction are determined in correspondence with movement of the slider, and an electric current is selectively applied to the exciting coils of said plural electromagnet units. Upon application of electric current to the respective exciting coils, the directions of the electric current applied to the respective exciting coils are selected so as to reduce a leak magnetic field around a wafer on the substrate stage.

9 Claims, 13 Drawing Sheets

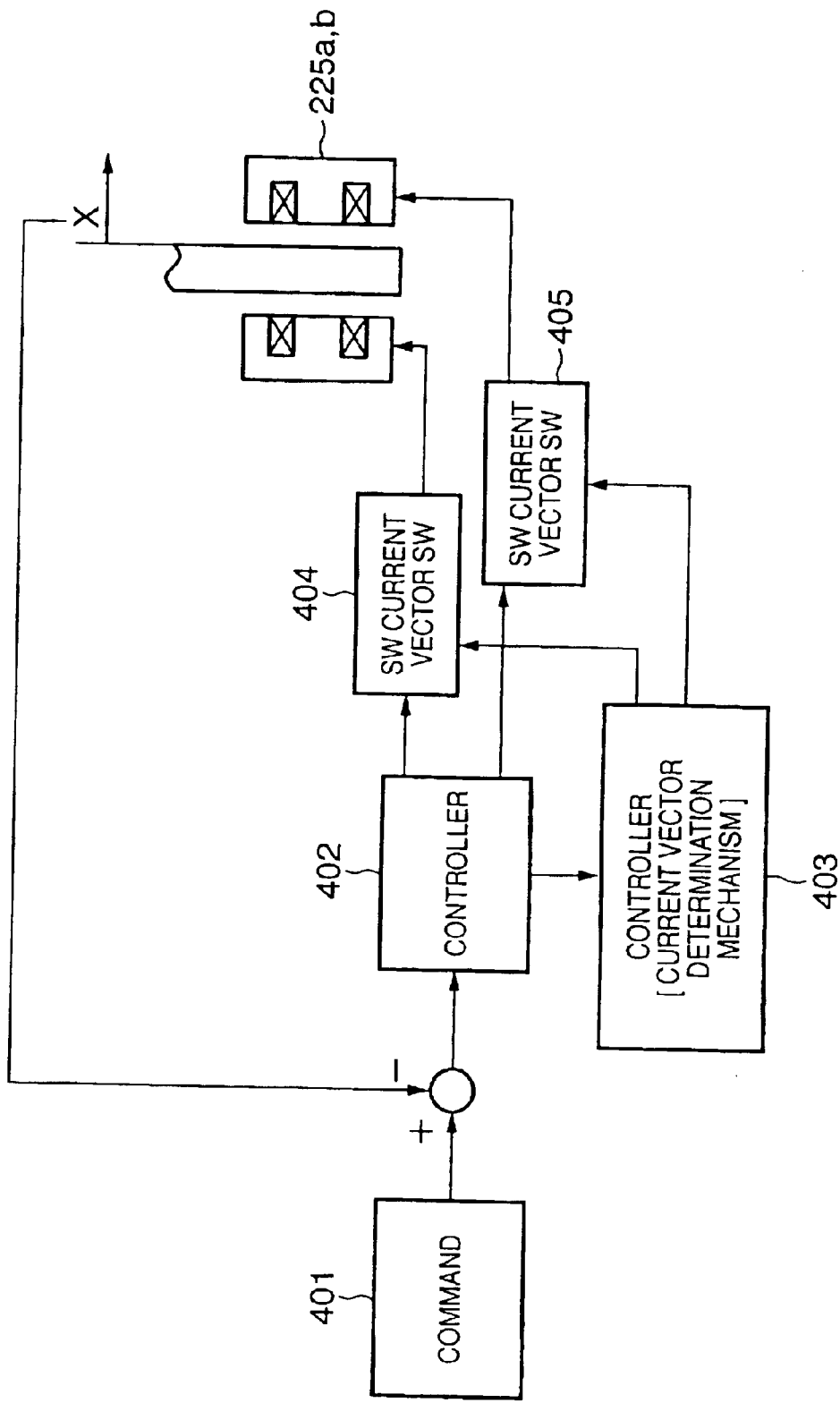

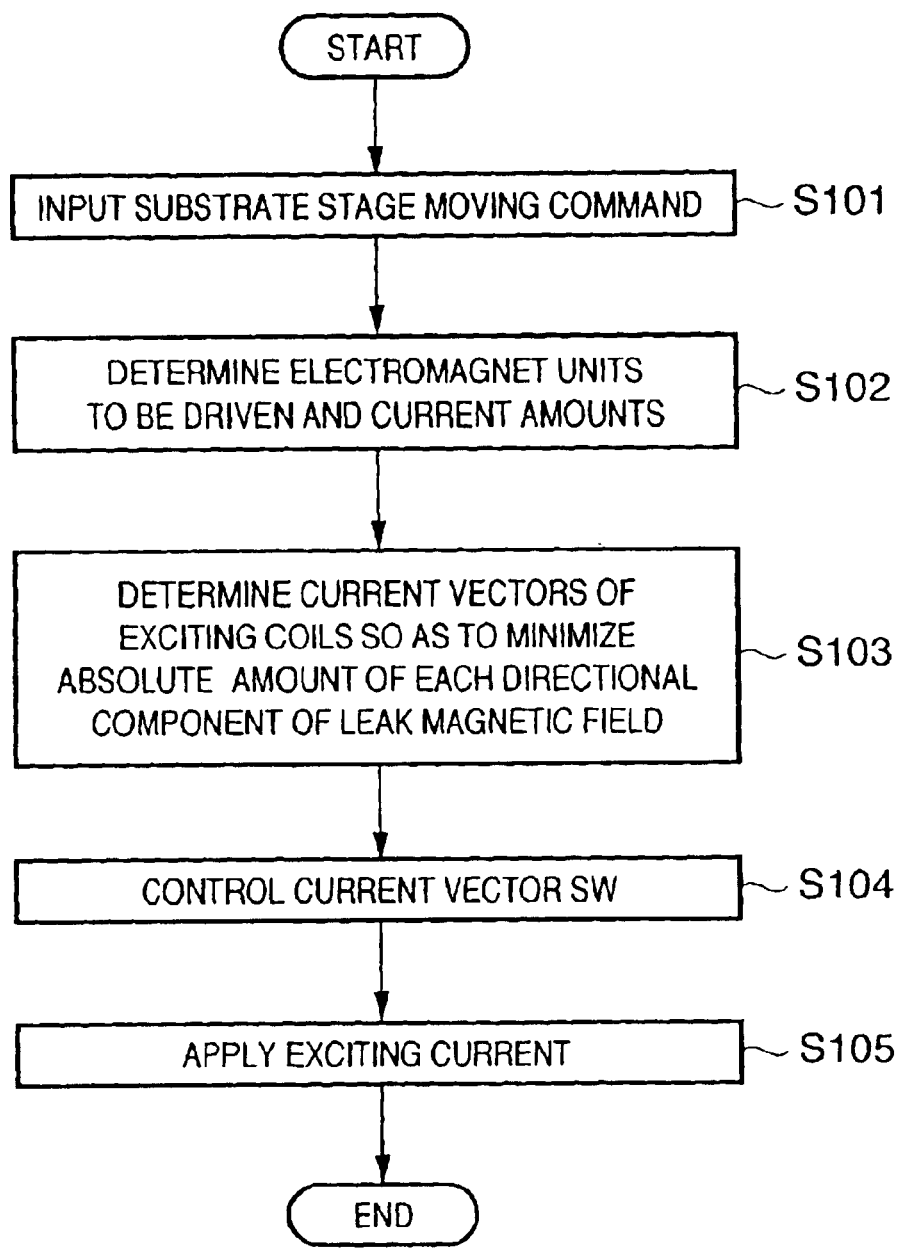

STAGE APPARATUS AND ITS DRIVING METHOD, EXPOSURE APPARATUS AND DEVICE MANUFACTURING METHOD

FIELD OF THE INVENTION

The present invention relates to a stage apparatus and its driving method, an exposure apparatus using the stage apparatus and a device manufacturing method using the exposure apparatus, and more particularly, to a stage apparatus preferably applied to an electron beam exposure apparatus which performs pattern drawing directly on a wafer or mask/reticle exposure using plural electron beams.

BACKGROUND OF THE INVENTION

In manufacturing of semiconductor apparatuses, lithography for optically reduction-transferring various patterns formed on a mask onto a wafer is utilized. As extremely high accuracy is required for mask pattern drawing used in the lithography, an electron beam exposure apparatus is used for this purpose. Further, even in a case where a pattern is directly drawn on a wafer without mask, the electron beam exposure apparatus is used.

The electron beam exposure apparatus includes a point beam type apparatus which uses a beam in spot, a variable rectangular beam type apparatus which uses a beam having a variable-size rectangular cross-section, and the like.

These electron beam exposure apparatuses generally have an electron gun unit to generate an electron beam, an electron optical system to guide the electron beam emitted from the electron gun unit onto a sample, a stage system to scan the entire surface of the sample with the electron beam, and an objective polarizer for positioning the electron beam on the surface of the sample with high accuracy.

As electron-beam positioning response is extremely high, generally, the system is constructed with emphasis on measurement of a shift amount of the posture and/or position of the stage to feed back the measured positional shift amount to electron beam positioning by the polarizer to scan the electron beam, rather than on improvement of the mechanical control characteristic of the stage. Further, as the stage is provided in a vacuum chamber and variation of magnetic field which influences the electron beam positioning must be prevented, the conventional stage, simply moved in a plane direction, comprises limited contact-type mechanism elements such as a rolling guide and a ball-screw actuator.

Such contact-type mechanism elements cause a problem of lubrication and a problem of dusting. To solve these problems, Japanese Published Unexamined Patent Application No. Hei 11-194824 discloses a non-contact type 6 freedom stage using an electromagnet actuator and a magnetic shield. According to this system, as a leak magnetic field from the electromagnet is blocked by the magnetic shield, the variation of leak magnetic field is small, and high clean environment can be ensured, and further, a high-accuracy positioning operation even in a vacuum environment can be realized.

However, in the non-contact type 6 freedom stage using electromagnet actuator and magnetic shield, as the structure of the magnetic shield is complicated, the thickness of the magnetic shield portion increases the weight of the stage. For this reason, in the lithography to respond to requirements of higher accuracy and speed, it is difficult to provide a stage to attain high acceleration/deceleration and high-speed positioning.

To realize a future high-speed stage driving (high acceleration/deceleration and high-speed positioning), it is effective to reduce the weight of the stage.

Accordingly, there is an increasing need for a light-weight magnetic shield. Especially, it is desired that the leak magnetic field is reduced by improving drive control of the electromagnet actuator so as to realize the resulting simplification and weight reduction of the magnetic shield.

SUMMARY OF THE INVENTION

According to one aspect of the present invention, there is provided a stage apparatus, comprising: a first stage; plural electromagnet units that generate a moving force in a predetermined direction to the first stage by application of electric current to an exciting coil; application means for selectively applying the electric current to the exciting coil of the plural electromagnet units, based on a moving force and its direction to be applied to the first stage; and control means for, upon application of the electric current to the exciting coil by the application means, determining directions of the electric current to be applied to respective exciting coils so as to reduce a leak magnetic field around the first stage.

According to another aspect of the present invention, there is provided a control method for a stage apparatus, having a first stage, plural electromagnet units that generate a moving force in a predetermined direction to the first stage by application of electric current to an exciting coil, comprising: an application step of selectively applying the electric current to the exciting coil of the plural electromagnet units, based on a moving force and its direction to be applied to the first stage; and a control step of, upon application of the electric current to the exciting coil by the application means, determining directions of the electric current to be applied to respective exciting coils so as to reduce a leak magnetic field around the first stage.

Further, according to the present invention, provided are an exposure apparatus which performs exposure processing on a photoresist substrate using the above stage apparatus and a device manufacturing method using the exposure apparatus.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a block diagram showing a control construction for current vector direction control;

FIG. 8 is a flowchart showing the current vector direction control according to the embodiment;

DETAILED DESCRIPTION OF THE PREFERRED EMBODIMENTS

Preferred embodiments of the present invention will now be described in detail in accordance with the accompanying drawings.

Figure 1:
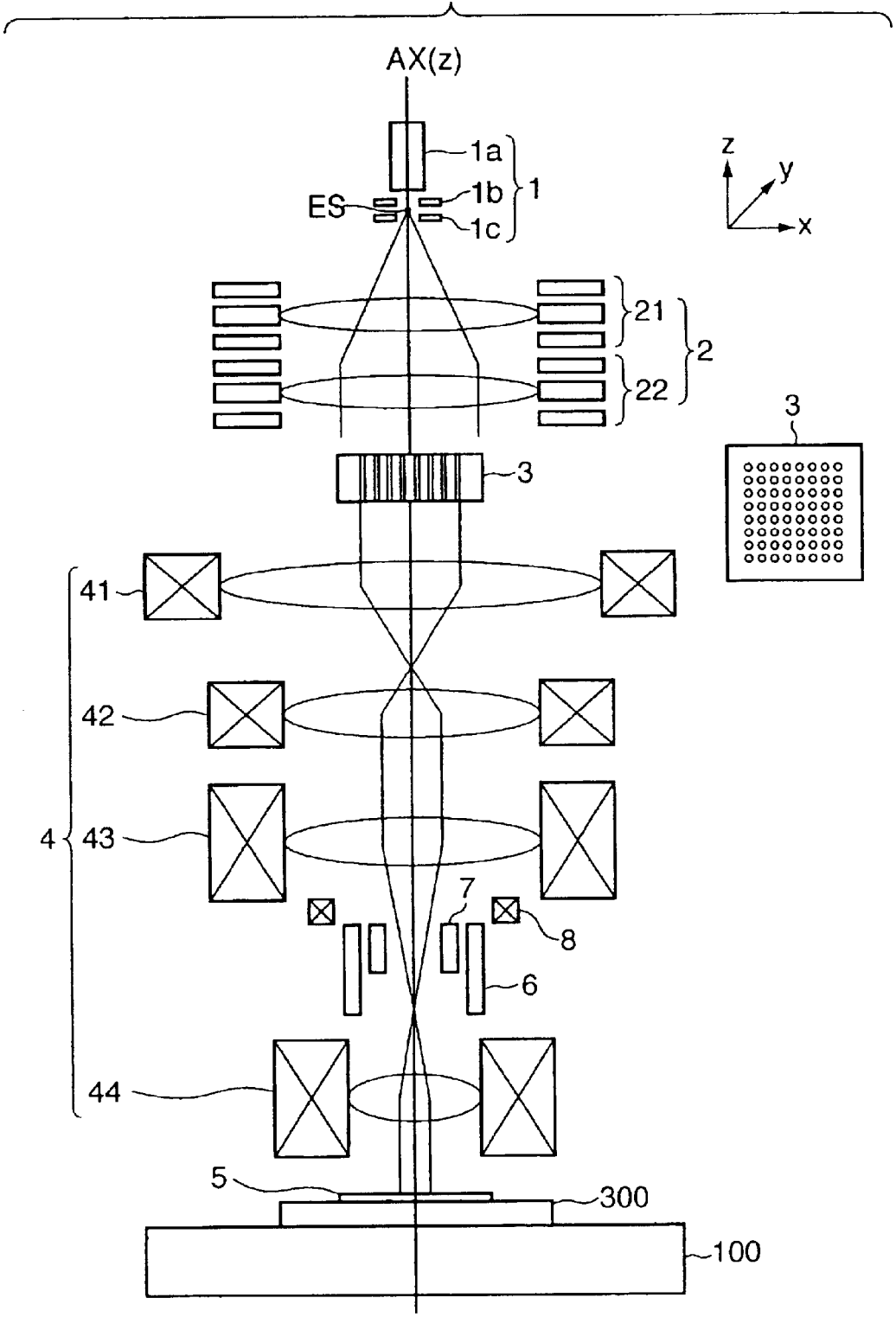
FIG. 1 is a schematic diagram showing a construction of an electron beam exposure apparatus according to an embodiment of the present invention.

FIG. 1 is a schematic diagram showing a construction of an electron beam exposure apparatus according to an embodiment of the present invention. In FIG. 1, reference numeral 1 denotes an electron gun including a cathode 1a, a grid 1b and an anode 1c. In the electron gun 1, electrons radiated from the cathode 1a form a cross over image between the grid 1b and the anode 1c (hereinbelow, the cross over image is referred to as an "electron source").

The electrons radiated from the electron gun 1 become an approximately-collimated beam by a condenser lens 2 with its front focal point in the position of the electron source. The condenser lens 2 of the present embodiment has 2 pairs of (21 and 22) unipotential lenses having 3 opening electrodes. The approximately-collimated beam obtained by the condenser lens 2 is incident on a correction electron optical system 3. The correction electron optical system 3 has an aperture, a blanker array, a multi charge beam lens, an element electron optical system array unit, a stopper array and the like.

The correction electron optical system 3 forms plural light-source intermediate images, and the respective intermediate images are reduction-projected by a reduction electron optical system 4 to be described later, and light source images are formed on a wafer 5. At this time, the correction electron optical system 3 forms the plural intermediate images such that the interval between the light source images on the wafer 5 is an integral multiple of the size of the light source image. Further, the correction electron optical system 3 forms the plural intermediate images, in different positions in an optical axial direction in correspondence with curvature of image surface of the reduction electron optical system 4, where aberration, occurred upon reduction projection of the respective intermediate images by the reduction electron optical system 4 on the wafer 5, can be corrected.

The reduction electron optical system 4 includes 2 pairs of symmetrical magnetic tablets each pair having a first projection lens 41 (43) and a second projection lens 42 (44). Assuming that the focal distance of the first projection lens 41 (43) is f1 and that of the second projection lens 42 (44), f2, as the distance between the two lenses, f1+f2 holds. An object point on an optical axis AX is positioned in the focal point of the first projection lens 41 (43), and an image point is on the focal point of the second projection lens 42 (44). The image is reduced to —f2/f1. Further, as two lens magnetic fields are determined so as to mutually oppositely act, Seidel aberrations and chromatic aberrations regarding rotation and magnification can be cancelled except spherical aberration, isotropic astigmatism, isotropic coma, image-surface curvature aberration, and axial chromatic aberration.

Numeral 6 denotes a polarizer which polarizes plural electron beams from the correction electron optical system 3 to displace the plural light source images on the wafer 5 by an approximately the same displacement amount in X and Y directions. Although the polarizer 6 is not shown, it includes a main polarizer used in case of wide polarizing width and a sub polarizer used in case of narrow polarizing width. Preferably, the main polarizer comprises an electromagnetic polarizer and the sub polarizer comprises an electrostatic polarizer.

Numeral 7 denotes a dynamic focus coil which corrects shift of focusing position of the light source image due to polarization aberration upon operation of the polarizer 6. Numeral. 8 denotes a dynamic stigmatic coil which corrects an astigmatic aberration caused by polarization, as in the case of the dynamic focus coil 7.

Numeral 100 denotes an XY stage, holding a substrate stage 300, movable in the XY directions orthogonal to the optical axis AX (X axis). The substrate stage 300, holding the wafer 5, can be driven in 6 axial directions, i.e., respective X, Y and X axial directions and rotational directions about the respective axes.

Next, the structure of the XY stage 100 according to the present embodiment will be described in detail with reference to FIGS. 2 to 4.

Figure 2:
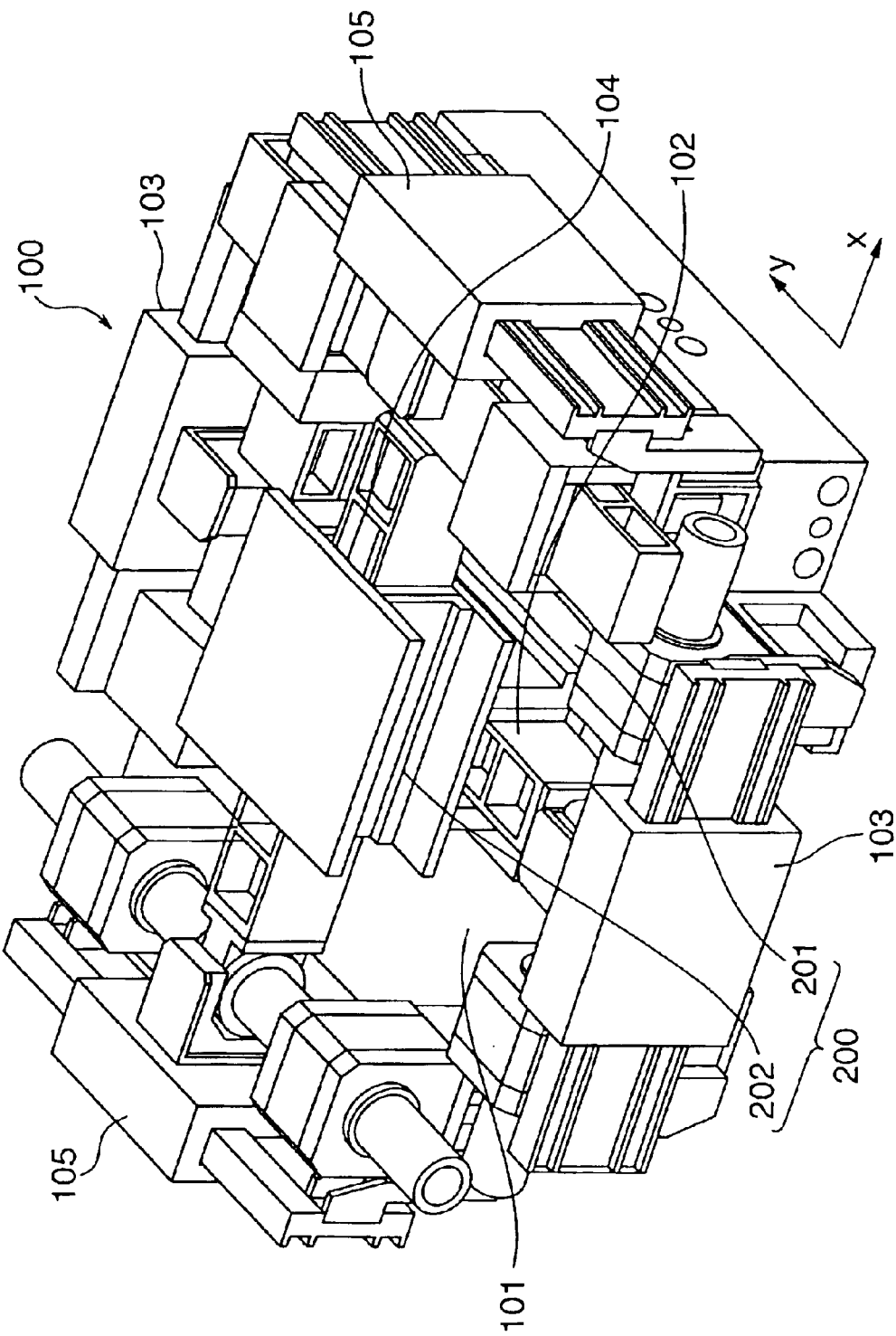
FIG. 2 is a perspective view showing an XY stage 100 according to the embodiment.

FIG. 2 is a perspective view showing the XY stage 100 according to the present embodiment. In the XY stage 100, a center slider 200 moves on a stage base 101. An X movable guide 102 is moved by a linear motor 103 in the X direction, and a Y movable guide 104 is moved by a linear motor 105 in the Y direction.

The center slider 200 has a bottom plate 201 and side plates 202. A bearing, opposite to an upper surface of the stage base 101 is provided on a lower surface of the bottom plate 201. Further, a similar bearing is provided inside the side plates 202, thus holding the X movable guide 102 and the Y movable guide 104. The X movable guide 102 and the Y movable guide 104 are arranged in a cross shape. When the center slider 200 is moved in the X direction, the X movable guide 102 is moved in the X direction, thereby the center slider 200 is smoothly moved in the X direction along side surfaces of the Y movable guide 104 and the upper surface of the stage base 101. Further, when the center slider 200 is moved in the Y direction, the Y movable guide 104 is moved in the Y direction, thereby the center slider 200 is smoothly moved in the Y direction along side surfaces of the X movable guide 102 and the upper surface of the stage base 101.

Figure 3:
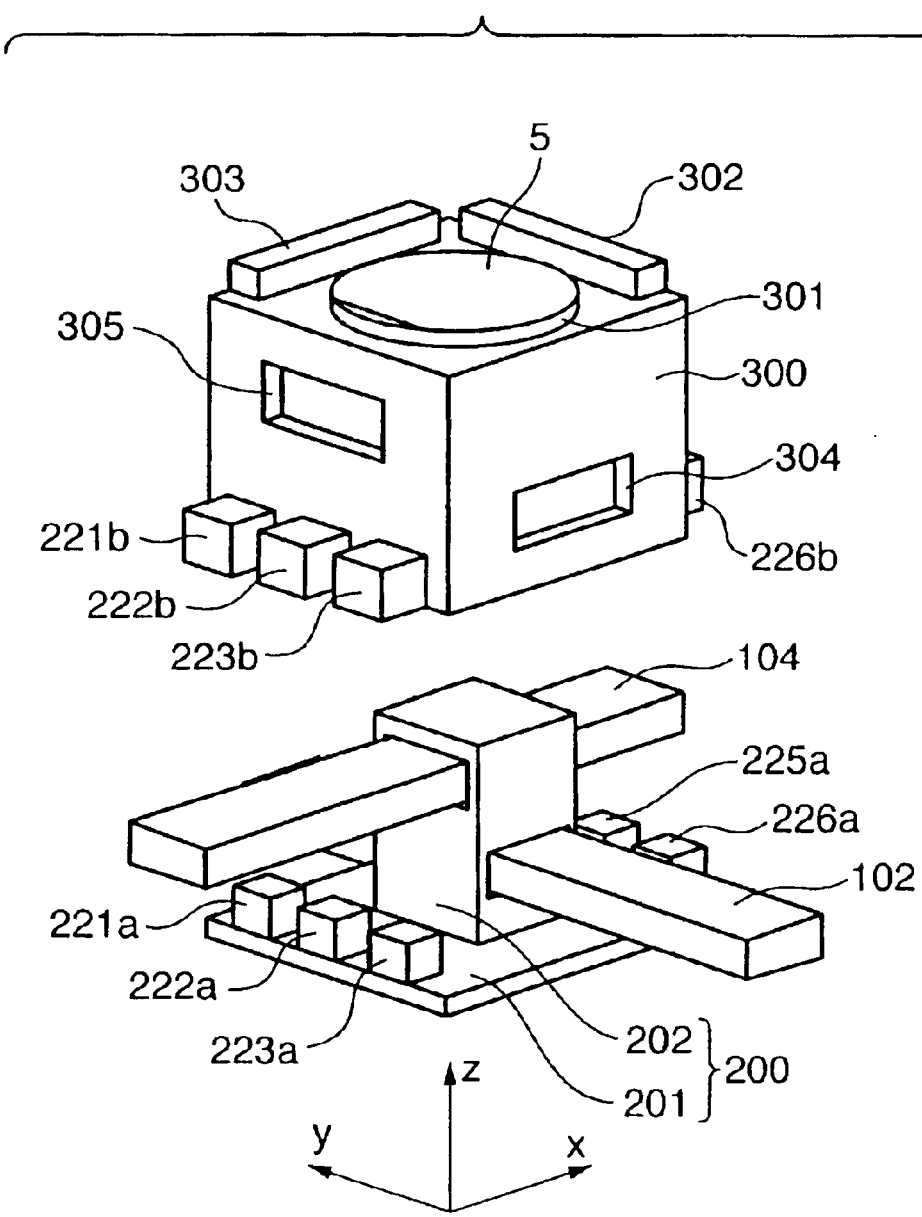
FIG. 3 is a perspective view schematically showing the structure of a center slider and that of a substrate stage according to the embodiment.

FIG. 3 is a perspective view schematically showing the structure of the center slider and that of the substrate stage according to the present embodiment. As shown in FIG. 3, the substrate stage 300 is a 6 freedom stage, holding the wafer 5, which can be driven in the optical axis (Z axis) direction, translation (X axis and Y axis) directions, rotational (θ) direction about the Z axis and tilt directions, with respect to the center slider 200. The driving of the substrate stage 300 can be realized by 6 electromagnet units.

As described in FIG. 2, the center slider 200, holding the 6 freedom substrate 300, is an XY stage movable in the XY directions orthogonal to the optical axis (Z axis).

The substrate stage 300 has, for example, a substrate holder 301 to hold a wafer, an X reflecting mirror 302 and a Y reflecting mirror 303 for measuring the position of the stage on its upper surface. An XY position of the substrate stage is measured by a laser interferometer held in a sample chamber (not shown) based on a chamber inner-wall reference position.

Note that measurement is also performed in the θ and tilt directions using these reflecting mirrors. Preferably, the θ measurement is performed from the side orthogonal to the array of the plural beams. Note that the Z directional measurement is made by an optical sensor using nonphotosensitive light. Further, as a servo sensor, an encoder for vacuum environment may be used.

The substrate stage 300 has a basket-shaped structure surrounding the center slider 200, where an X opening 304 and a Y opening 305 through which the X movable guide 102 and the Y movable guide 104 are inserted are provided.

In the substrate stage 300, 6 electromagnet unit moving elements (a Z1 electromagnet unit moving element 221b, a Y1 electromagnet unit moving element 222b, a Z2 electromagnet unit moving element 223b, a Z3 electromagnet unit moving element 224b, an X1 electromagnet unit moving element 225b, and a Y2 electromagnet unit moving element 226b) are fixed to end positions of side surfaces on the side of the bottom plate 201 of the center slider 200. Further, 6 electromagnet unit fixing elements (a Z1 electromagnet unit fixing element 221a, a Y1 electromagnet unit fixing element 222a, a Z2 electromagnet unit fixing element 223a, a Z3 electromagnet unit fixing element 224a, an X1 electromagnet unit fixing element 225a, and a Y2 electromagnet unit fixing element 226a) are fixed to the bottom plate 201 so as to accommodate the respective moving elements.

Figure 4:
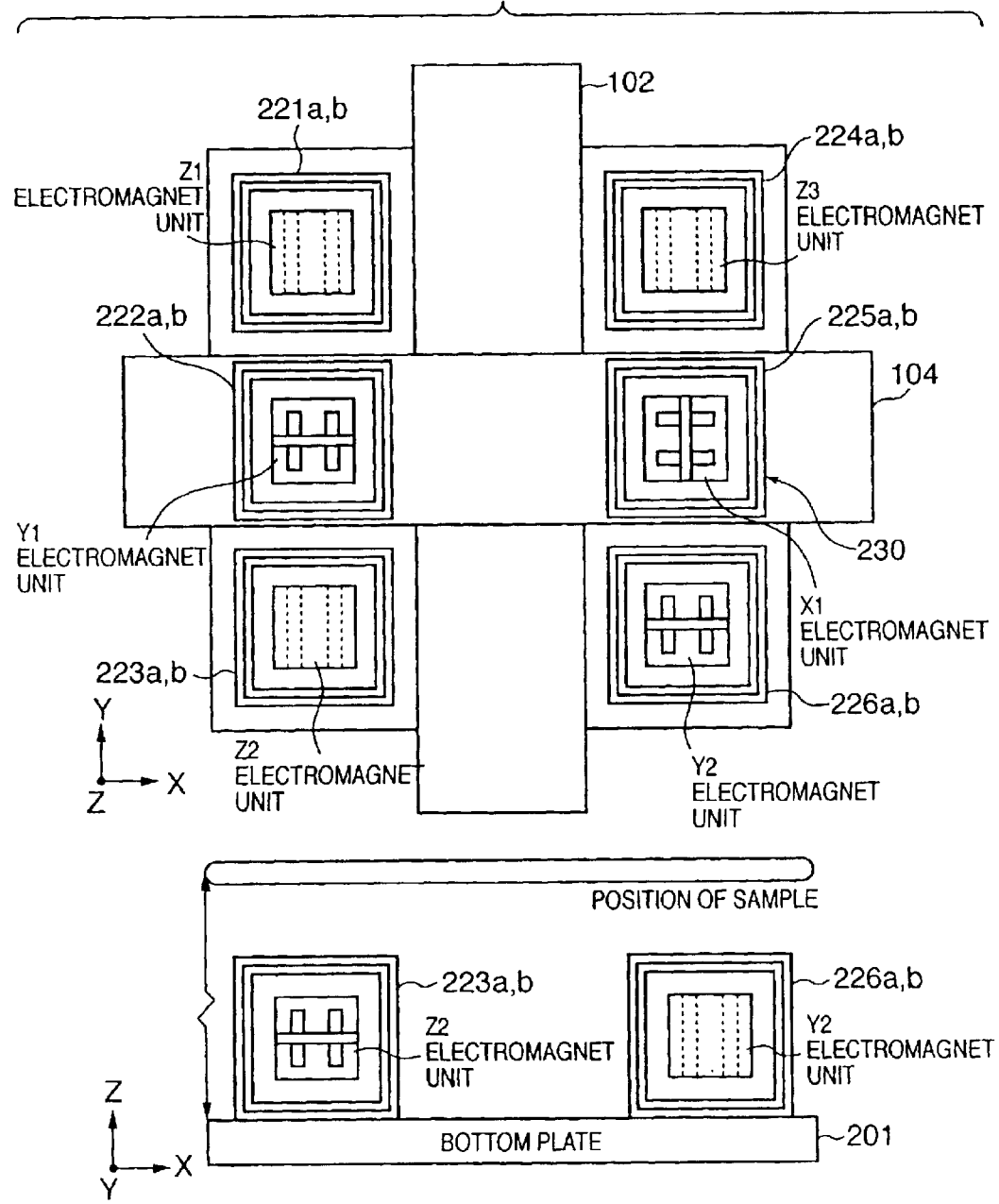
FIG. 4 is an explanatory view showing driving directions of respective electromagnet units.

As shown in FIG. 4, the electromagnet units are 3 electromagnet units (Z1 electromagnet unit (221a,b), Z2 electromagnet unit (223a,b) and Z3 electromagnet unit (224a,b)) to generate a driving force in the Z direction, one electromagnet unit (X1 electromagnet unit (225a,b)) to generate a driving force in the X direction, and 2 electromagnet units (Y1 electromagnet unit (222a,b) and Y2 electromagnet unit (226a,b)) to generate a driving force in the Y direction. In the present embodiment, the substrate stage can be 6-freedom driven by combination of plural electromagnet units for plural directions. Note that the combination of the electromagnet units in the respective directions is not limited to the above combination.

The 6 electromagnet units are provided with a magnetic shield 230 which is multilayered with permalloy for prevention of magnetic field variation. The electromagnet units are provided sufficiently away from the reduction electron optical system for prevention of variation of magnetic field due to leak magnetic field from the reduction electron optical system. More particularly, the positions of the respective electromagnet units are preferably on the opposite side to the substrate in the Z direction via the center of gravity of the center slider.

Figure 5:
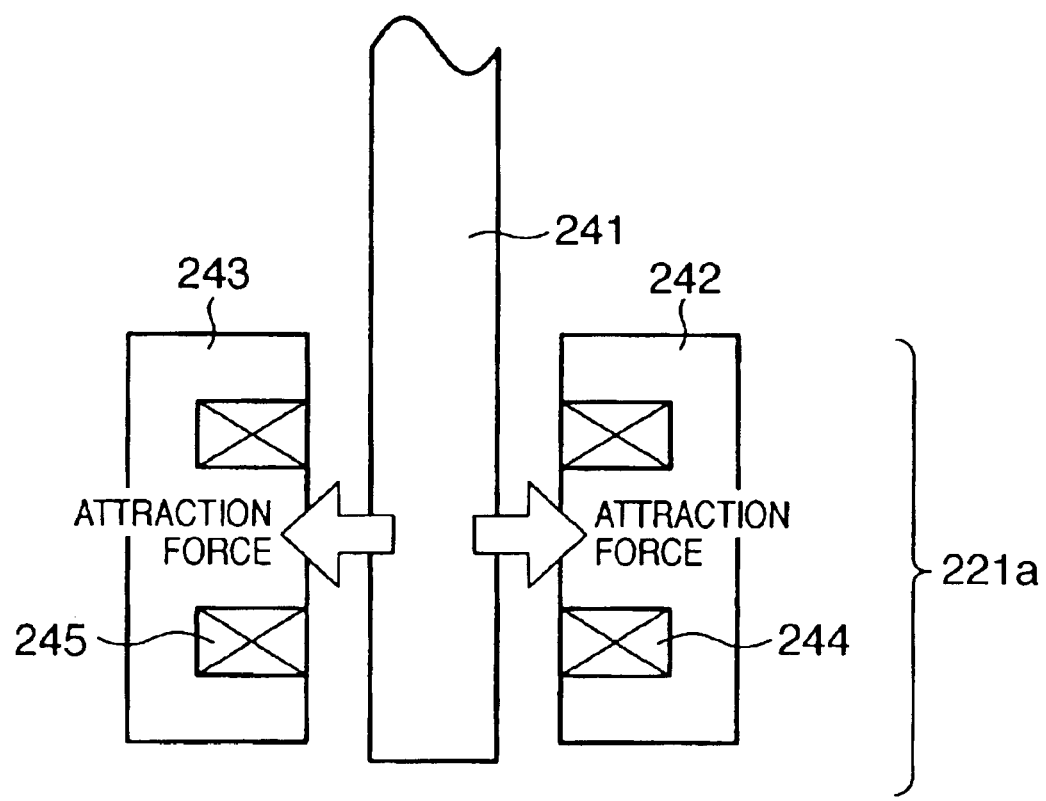
FIG. 5 is an explanatory view of the details of the electromagnet unit.

Next, the details of the electromagnet unit will be described with reference to FIG. 5. 1 set of electromagnet unit has an iron I core 241 as an electromagnet unit moving element, 2 iron E cores 242 and 243 as electromagnet unit fixing elements and 2 exciting coils 244 and 245. In each electromagnet unit, the exciting coils 244 and 245 are put around the iron E cores 242 and 243, and the iron E cores 242 and 243 are provided so as to hold the iron I core 241 from both sides with a predetermined gap.

The iron I core 241 as an electromagnet unit moving element is fixed on the side of the substrate stage moving element (221b to 226b). Further, the 2 iron E cores 242 and 243 and the 2 exciting coils 244 and 245 are integrally connected to the center slider and they do not relatively move. The iron E cores 242 and 243 are excited by feeding an electric current through the exciting coils 244 and 245, then a magnetic circuit from the iron E cores 242 and 243 via the air gap to the iron I core 241 is formed, to generate a magnetic attraction force between the iron E cores and the iron I core. In this arrangement, the iron I core can be attracted from both directions, and the iron I core 241 as a moving element can be driven in positive and negative directions on 1 axis.

In the present embodiment, in the XY stage and the substrate stage having the above structure, in a case where the plural electromagnet units are driven by feeding an electric current through the exciting coils of the plural electromagnet units, an optimum combination of electric current directions is selected based on the positions and directions of electromagnet units through which the current is to be fed and the values of the electric current. The optimum combination is the combination of electric current directions to form space where distributions of magnetic fields around the respective electromagnets, each uniquely determined by the direction of current vector of the electric current to be fed through the exciting coil, are overlapped with each other and cancel out each other, and the leak magnetic field is reduced around the substrate (wafer 5) as the whole substrate stage 300.

As a result of the above current control, according to the present embodiment, as appropriate selection of current vectors of electric current to be fed through the plural electromagnet units, at least variation of leak magnetic field around a sample can be reduced, and simplification and weight reduction of electric shield can be realized, thus a high-speed stage capable of high acceleration/deceleration can be obtained.

Hereinbelow, a method of driving the 6 electromagnet units provided on the substrate stage according to the present embodiment will be described.

Figure 6A:
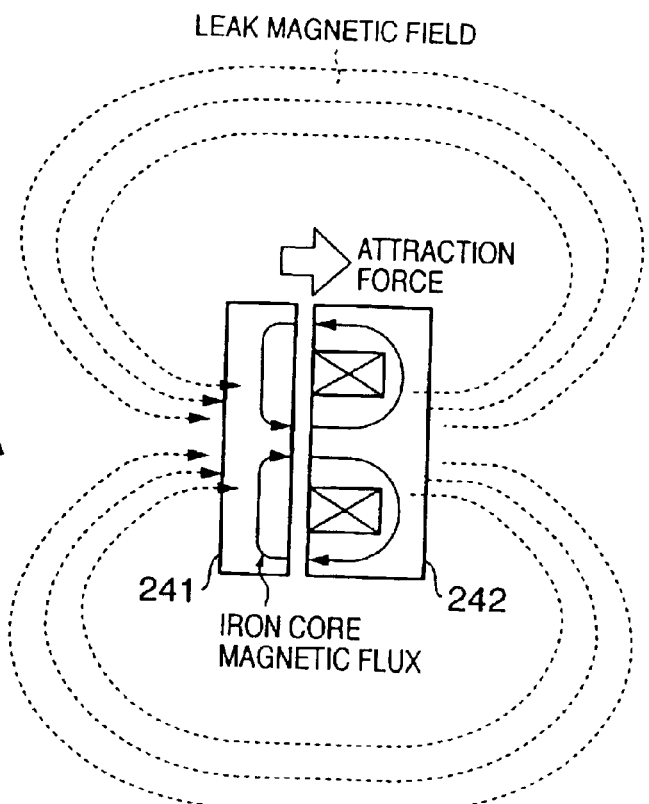
FIGS. 6A and 6B are explanatory views of a leak magnetic field formed in space around an electromagnet by driving of the electromagnet unit.
Figure 6B:
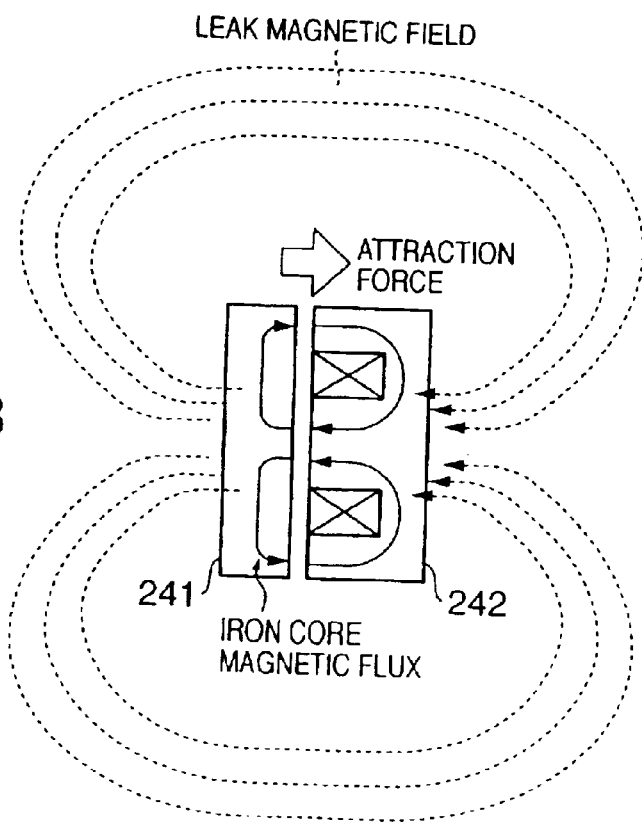

FIGS. 6A and 6B are explanatory views conceptually showing a leak magnetic field formed in space around the electromagnet by driving of the electromagnet unit. In FIGS. 6A and 6B, an iron E core 242 drives the iron I core 241 in the same rightward direction, but the current vectors of electric current flowing through the exciting coils are in opposite directions in FIGS. 6A and 6B. Accordingly, the direction of the distribution of the leak magnetic field formed around the electromagnet unit in FIG. A and that in FIG. B are opposite. In this arrangement, when 1 electromagnet unit is driven, the distribution of the magnetic field around the electromagnet unit can be operated by controlling the direction of current vector independently of a unit driving direction.

FIG. 7 is a block diagram showing a control construction for current vector direction control. Note that in FIG. 7, a controller 402 is connected to the X1 electromagnet unit (225a,b), however, other electromagnet units are connected via respective current vector switches SW to the controller 402. Further, FIG. 8 is a flowchart showing the current vector direction control according to the present embodiment.

In FIG. 7, the controller 402 analyzes the difference between a moving command 401 to move the substrate stage 300 and the position of the substrate stage 300 (indicated with alphabet X in FIG. 7), selects electromagnetic units among the 6 electromagnet units, selects one of the 2 exciting coils in the selective electromagnet units, and determines the amounts of electric current to be fed through the respective exciting coils (steps S101 and S102). A controller 403 determines an optimum combination of current vectors for the plural exciting coils to which an exciting current is applied, based on the positions, orientations and current amounts of the electromagnet units determined by the controller 402 (step S103). Then the controller 403 controls the current vector switches 404 to determine the directions of electric currents in the respective exciting coils (step S104). When the directions of the current vectors of electric currents to be applied to the respective exciting coils are determined, the controller 402 applies the electric current in the amounts determined at step S102 to the respective exciting coils.

As described above, for driving of the 6 electromagnet units to move the substrate stage 300 in the 6 axial directions, a current vector determination mechanism is provided so as to operate respective current vectors for the 6 electromagnet units.

Note that the optimum combination of current vectors may be changed in accordance with setting of the controller 403. For example, regarding magnetic fields leaked from the electromagnet units by driving the substrate stage, "the absolute values of XY directional elements of the leak magnetic field distributed around a sample surface are minimized", otherwise, "the absolute value of Z directional element of the leak magnetic field distributed around the sample surface is minimized" may be a target setting.

Next, the advantages upon operation of the above-described current vector determination mechanism will be more particularly described with reference to FIGS. 9A to 9G. Note that in these figures, the substrate stage is step-moves in a Y forward direction.

When the substrate stage step-moves in the Y positive direction, to transmit a Y-directional thrust force to a substrate stage moving element, the exciting coil, positioned on the Y positive direction side in the Y1 electromagnet unit 222a,b, is energized to excite the iron E core, and the exciting coil, positioned on the Y positive direction side in the Y2 electromagnet unit 226a,b, is energized to excite the iron E core. Further, as the 6 electromagnet units are positioned on the opposite side to the substrate (wafer 5) in the Z direction via the center of gravity of the center slider 200, turning moment about the X axis occurs in the substrate stage moving element. To cope with the moment, the exciting coil, positioned on the Z positive direction side in the Z1 electromagnet unit 221a,b, is energized to excite the iron E core, and the exciting coil, positioned on the Z negative direction side in the Z2 electromagnet unit 223a,b, is energized to excite the iron E core.

In a case where the above current application is performed without operation of the current vector determination mechanism described in FIGS. 7 and 8, the current vectors of the Y1 electromagnet unit, Y2 electromagnet unit, Z1 electromagnet unit and Z2 electromagnet unit are respectively in the Y positive direction, the Y positive direction, the Z positive direction and the Z positive direction. FIGS. 9A to 9E show as the result of calculation of the distribution of absolute values of magnetic flux Bx in the X direction around the sample.

Figure 9A:
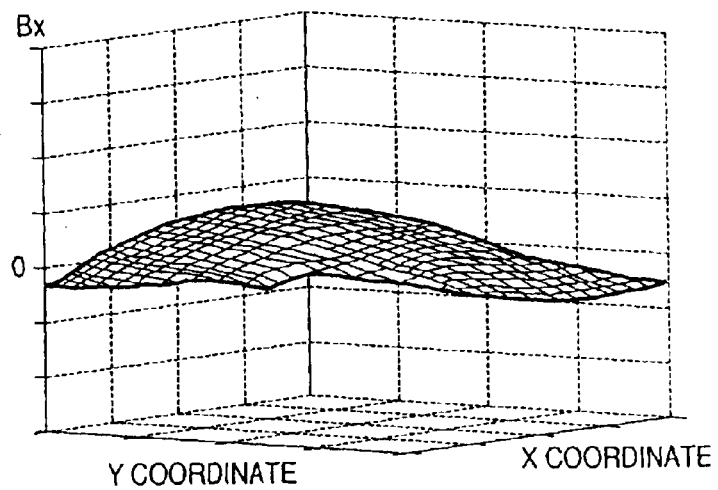
FIGS. 9A to 9G are graphs showing reduction of the leak magnetic field by a current vector determination mechanism according to the embodiment.
Figure 9B:
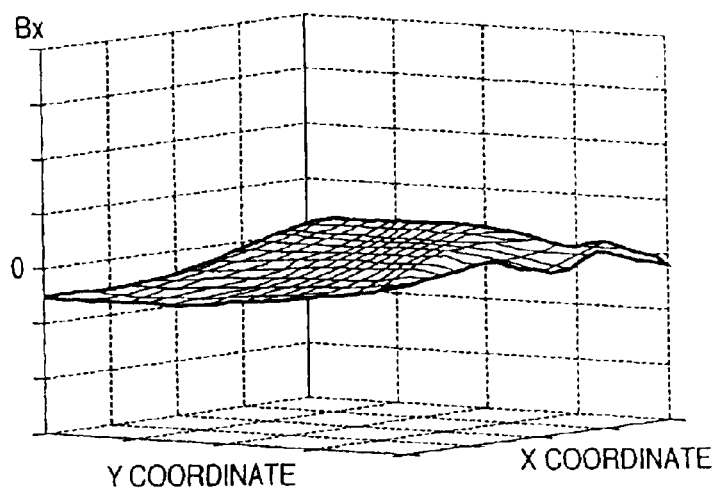
Figure 9C:
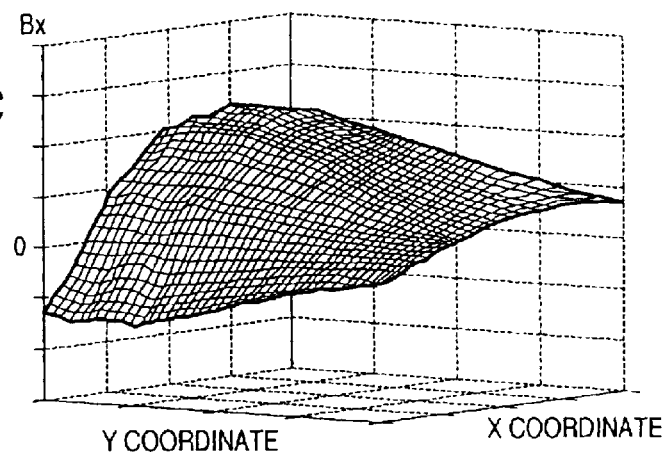
Figure 9D:
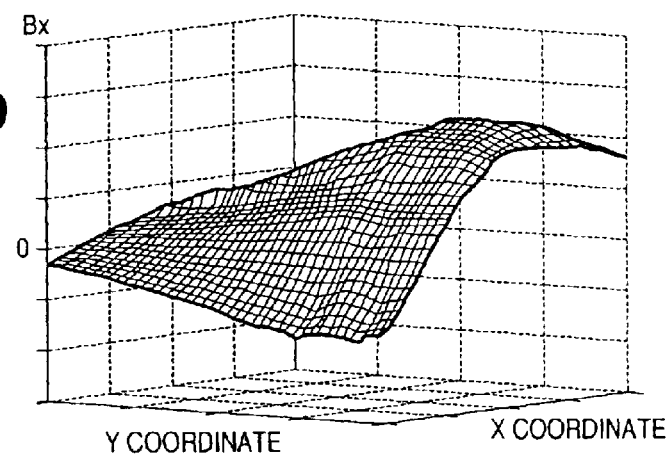
Figure 9E:
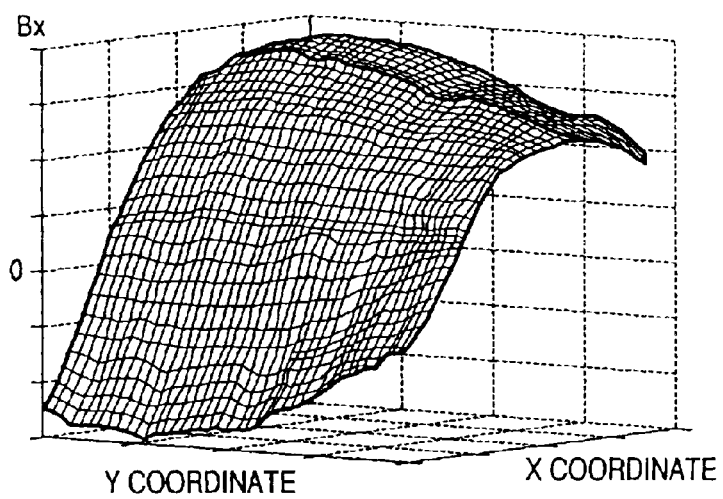
Figure 9F:
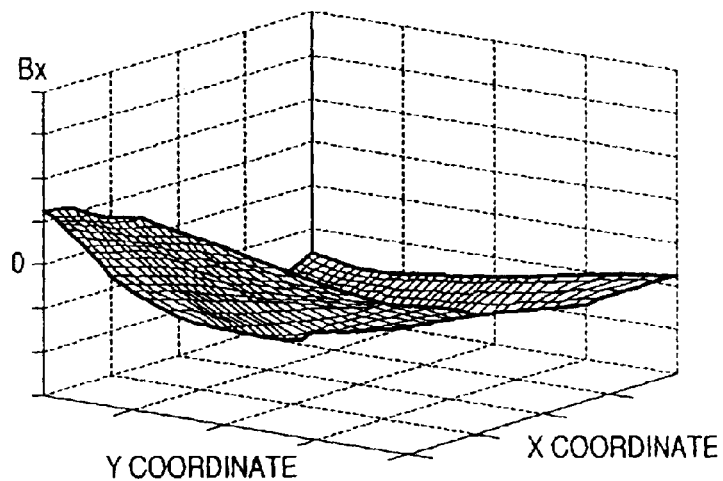
Figure 9G:
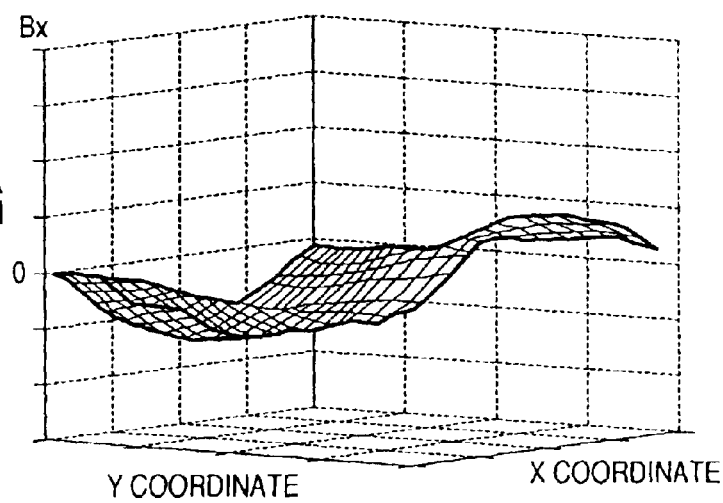

On the other hand, in a case where the current vector determination mechanism functions with a target setting "the distribution of magnetic field in the X direction around the sample surface is minimized with absolute value", the current vectors of the Y1 electromagnet unit, Y2 electromagnet unit, Z1 electromagnet unit and Z2 electromagnet unit are respectively in the Y positive direction, the Y positive direction, the Z negative direction and the Z positive direction. Otherwise, all the vectors may be in opposite directions, the Y negative direction, the Y negative direction, the Z positive direction and the Z negative direction. Note that the combination of the current vectors is not limited to these combinations. FIGS. 9F and 9G show as the result of calculation of the distribution of absolute values of magnetic flux Bx in the X direction around the sample.

Note that in the above example, the current vectors are independently set in the Z1 electromagnet unit and the Z2 electromagnet unit since the arrangements of the Z1 electromagnet unit and the Z2 electromagnet are different when the substrate stage 300 is viewed from the Z direction (from above). The distribution of magnetic field formed around the Z1 electromagnet unit and that formed around the Z2 electromagnet unit are similar, but the distributions of magnetic fields around the wafer 5 are important. The distributions of magnetic fields of the respective electromagnet units around the wafer are determined by the directions of the respective electromagnet units and relative positions from the wafer. Accordingly, if the relative positions of the Z1 electromagnet unit and the Z2 electromagnet unit from the wafer 5 are different, the distributions of magnetic fields of the respective units around the wafer 5 are different. For this reason, in the present embodiment, the current vectors are independently set in the Z1 electromagnet unit and Z2 electromagnet unit.

Next, the distribution of magnetic field on the sample surface when the current vector determination mechanism does not exist will be described. When an electric current with a positive directional current vector is fed through the exciting coil of the Y1 electromagnet unit, the distribution of magnetic field Bx in the X direction formed on the sample surface with the leak magnetic field from the Y1 electromagnet unit is as shown in FIG. 9A. When an electric current with a positive directional current vector is fed through the exciting coil of the Y2 electromagnet unit, the distribution of magnetic field Bx in the X direction formed on the sample surface with the leak magnetic field from the Y2 electromagnet unit is as shown in FIG. 9B. When an electric current with a positive directional current vector is fed through the exciting coil of the Z1 electromagnet unit, the distribution of magnetic field Bx in the X direction formed on the sample surface with the leak magnetic field from the Z1 electromagnet unit is as shown in FIG. 9C. When an electric current with a positive directional current vector is fed through the exciting coil of the Z2 electromagnet unit, the distribution of magnetic field Bx in the X direction formed on the sample surface with the leak magnetic field from the Z2 electromagnet unit is as shown in FIG. 9D. In a case where the exciting coils of these 4 electromagnet units are simultaneously energized, as the leak magnetic fields from the respective electromagnet units are overlapped with each other (the distributions in FIGS. 9A to 9D are overlapped with each other), the magnetic field Bx in the X direction on the sample surface has distribution as shown in FIG. 9E.

Next, the distribution of magnetic field on the sample surface when the current vector determination mechanism functions will be described. At this time, as the current vectors of the Y1 electromagnet unit, Y2 electromagnet unit, Z1 electromagnet unit and Z2 electromagnet unit are set respectively in the Y positive direction, the Y positive direction, the Z negative direction and the Z positive direction, the distributions of magnetic field Bx in the X direction formed on the sample surface by the respective electromagnet unit, in the case of the Y1 electromagnet unit, in the case of the Y2 electromagnet unit and in the case of the Z2 electromagnet unit are as shown in FIGS. 9A, 9B and 9D. In the case of the Z1 electromagnet unit, the distribution is as shown in FIG. 9F. Regarding the Z1 electromagnet unit, the difference between the distribution of electric field as shown in FIG. 9C when the current vector is in the Z positive direction and in the distribution as shown in FIG. 9F when the current vector is in the Z negative direction is the direction and polarity of the magnetic field. In a case where the exciting coils of these 4 electromagnet unit are simultaneously energized, as the leak magnetic fields from the respective electromagnet units are overlapped with each other (the distributions in FIGS. 9A, 9B, 9D and 9F are overlapped with each other), the magnetic field Bx in the X direction on the sample surface has distribution as shown in FIG. 9G. When an minus directional magnetic field and a plus directional magnetic field are overlapped with each other, they cancel out each other, and the magnetic fields are reduced. It is understood from FIGS. 9E and 9G that the distribution of the leak magnetic field in the X direction on the sample surface is reduced with the absolute value.

In this example, the polarity of the leak magnetic field from the Z1 electromagnet unit is inverted by changing the current vector of the Z1 electromagnet unit from Z positive direction to the Z negative direction, thereby cancellation of magnetic fields is caused when overlapped with the leak magnetic fields from the Y1 electromagnet unit, the Y2 electromagnet unit and the Z2 electromagnetic unit.

Further, in a case where the target setting of the current vector determination mechanism is "the distribution of magnetic field in the XY directions around the sample surface is minimized with absolute value", the current vectors of the Y1 electromagnet unit, Y2 electromagnet unit, Z1 electromagnet unit and Z2 electromagnet unit are respectively in the Y positive direction, the Y positive direction, the Z negative direction and the Z positive direction, otherwise the combination of all inverted current vectors (the Y negative direction, the Y negative direction, the Z positive direction and the Z negative direction). Note that the combination of the current vectors is not limited to these combinations.

Next, the step movement of the substrate stage in the X positive direction in the above arrangement will be described. In this case, to transmit an X-directional thrust force to the substrate stage moving element, the exciting coil, positioned on the X position direction side in the X1 electromagnet unit, is energized so as to excite the iron E core. Further, as the 5 electromagnet units are provided on the opposite side to the substrate in the Z direction via the center of gravity of the center slider, turning moment about the Y axis occurs in the substrate stage moving element by driving of the X1 electromagnet unit. To cope with the moment, the exciting coil, positioned on the Z positive direction side in the Z1 electromagnet unit, is energized so as to excite the iron E core, and the exciting coil, positioned on the Z negative direction side in the Z3 electromagnet unit, is energized so as to excite the iron E core.

In a case where the target setting of the current vector determination mechanism is "the distribution of magnetic field in the XY directions around the sample surface is minimized with absolute value", the settings of the current vectors of the X1 electromagnet unit, the Z1 electromagnet unit and the Z3 electromagnet unit are respectively in the X positive direction, the Z positive direction, and the Z negative direction, otherwise, all the vectors are in the inverse directions (the X negative direction, the Z negative direction and the Z positive direction). Note that the combination of the current vectors is not limited to these combinations.

Further, in a case where the substrate stage is step-moved in the XY directions, any of the combination of current vectors is applicable.

Note that the above target settings of the current vector determination mechanism are merely examples, and target settings such as "the distribution of magnetic field in the X direction around the sample surface is minimized", "the distribution of magnetic field in the Y direction around the sample surface is minimized with absolute value", "the distribution of magnetic field in the XY directions around the sample surface is minimized with absolute value" and "the distribution of magnetic field in all the directions around the substrate stage is minimized with absolute value" may be set.

Further, the 6 freedom stage structure using 6 electromagnet units is merely an example, but the substrate stage driving structure is not limited to the above structure.

Next, an example of method for determining the combination of current vectors will be described. Plural driving patterns to drive the substrate stage are determined in advance, and combinations of current vectors for the driving patterns are determined in advance, since once a driving pattern is determined, electromagnet units to be excited are determined. The following is an example of data previously input in the controller 403.

| Combination of current vectors Target setting | Driving pattern | | |
|---|---|---|---|
| | X directional step movement | Y directional step movement | XY directional step movement |
| Minimize distribution of magnetic field in X direction around sample surface | X1: positive Z1: positive Z3: positive | Y1: negative Y2: positive Z1: positive Z2: negative | X1: positive Y1: positive Y2: negative Z2: positive Z3: positive |
| Minimize distribution of magnetic field in Y direction around sample surface | X1: positive Z1: positive Z3: negative | Y1: positive Y2: positive Z1: negative Z2: positive | X1: positive Y1: positive Y2: positive Z2: positive Z3: negative |
| Minimize distribution of magnetic field in XY direction around sample surface | X1: positive Z1: positive Z3: negative | Y1: positive Y2: positive Z1: negative Z2: positive | X1: positive Y1: positive Y2: negative Z2: positive Z3: positive |
| Minimize distribution of magnetic field in Z direction around sample surface | X1: positive Z1: positive Z3: negative | Y1: positive Y2: positive Z1: negative Z2: positive | X1: positive Y1: positive Y2: positive Z2: positive Z3: negative |
| Minimize distribution of magnetic field in all directions around substrate stage | X1: positive Z1: positive Z3: negative | Y1: positive Y2: positive Z1: negative Z2: positive | X1: positive Y1: positive Y2: positive Z2: positive Z3: negative |

The driving patterns are determined for X-directional step movement, Y-directional step movement and XY-directional step movement. Further, plural target settings are made for the current vector determination mechanism corresponding to various purposes. The target setting is selected by user's input. On the other hand, regarding the driving pattern, the controller 403 determines the moving direction from the difference between the moving command 401 and the position of the substrate stage 300. Then the combination of current vectors of the respective electromagnet units is determined.

Further, as another example, it may be arranged such that the combinations of current vectors corresponding to the respective target settings and the respective driving patterns are not inputted in the controller 403 in advance. In this example, all the distributions of leak magnetic fields determined by the combinations of various current vectors corresponding to the respective target settings and the respective driving patterns are measured in advance and stored in the controller 403. The controller 403 determines an optimum combination of current vectors corresponding to a given target setting or a moving command based on the measurement information.

Further, the current vector determination mechanism is applicable to every stages using plural electromagnets. Further, the current vector determination mechanism may be operated not only by electrical control but also by mechanical control and operation, or human operation. In a case where the plural electromagnets are driven only by a well-known operation, it may be arranged such that an optimum combination of current vectors is selected by mechanically or manually changing the current vectors before the electromagnets are driven in respective driving patterns.

As described above, according to the present embodiment, as a current vector determination mechanism is provided to select directions of current vectors of current fed through plural electromagnet actuators, in the electromagnet stage, variation of leak magnetic field to at least around a sample can be reduced. In this arrangement, the magnetic shield can be simplified and weight-reduced, and a high acceleration/deceleration and high-speed stage can be obtained. As a result, a high-speed and high-accuracy electron beam exposure apparatus can be provided.

Next, an embodiment of device production utilizing the electron beam exposure apparatus having the above-described stage apparatus will be described.

Figure 10:
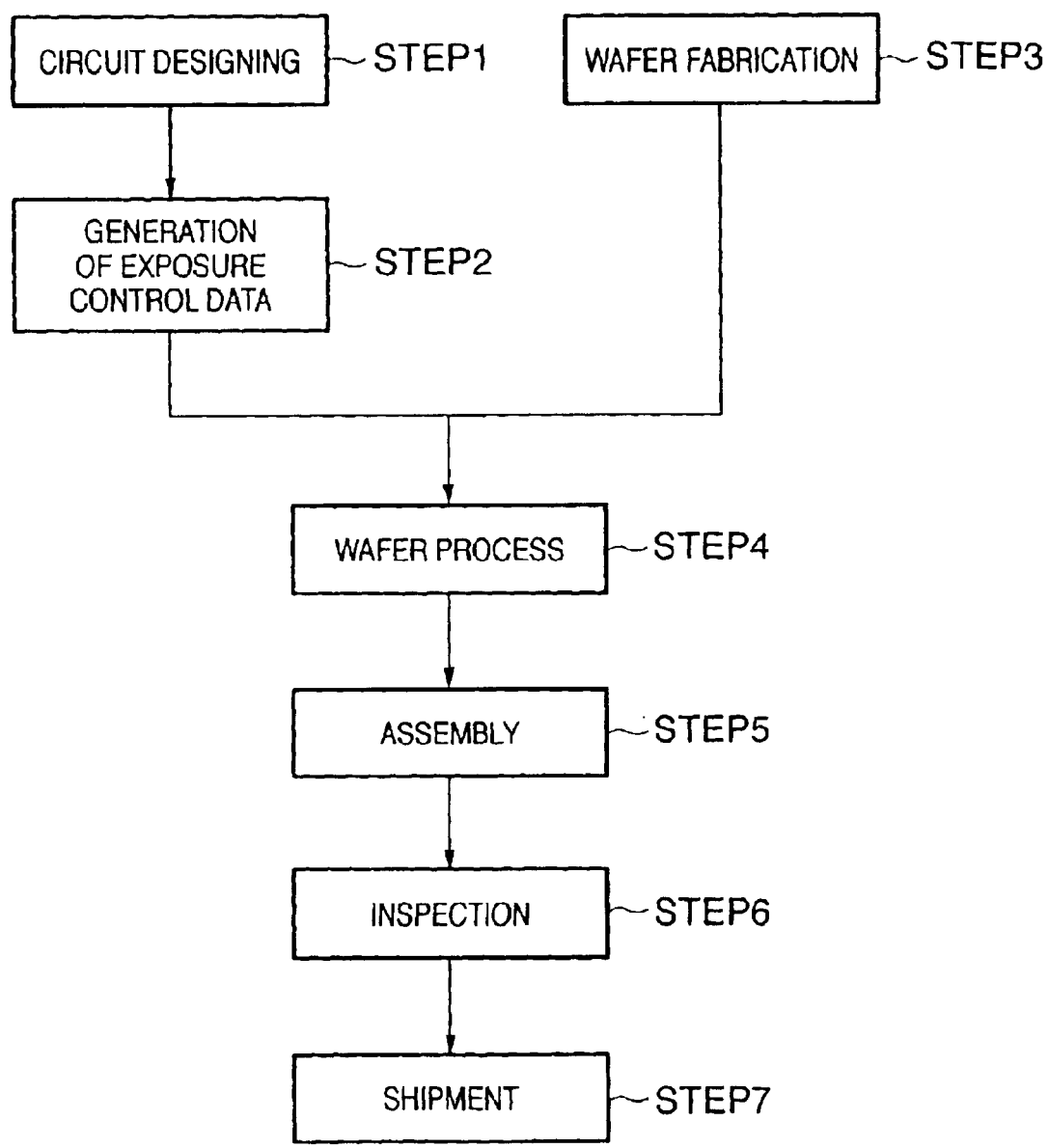
FIG. 10 is a flowchart showing a microdevice manufacturing flow.

FIG. 10 shows a microdevice (semiconductor chip such as an IC or LSI, a liquid crystal panel, a CCD, a thin-film magnetic head, a micromachine or the like) fabrication flow. At step 1 (circuit designing), a device pattern is designed. At step 2 (generation of exposure control data), exposure control data for the exposure apparatus is generated based on the designed circuit pattern. On the other hand, at step 3 (wafer fabrication), a wafer is fabricated by using material such as silicon. At step 4 (wafer process), called a preprocess, an actual circuit is formed on the wafer by a lithography technique using the above-described electron beam exposure apparatus in which the exposure control data has been inputted. At the next step 5 (assembly), called a postprocess, a semiconductor chip is fabricated by using the wafer processed at step 4. Step 5 includes an assembly process (dicing and bonding), a packaging process (chip encapsulation) and the like. At step 6 (inspection), inspections such as an operation check, a durability test and the like are performed on the semiconductor device formed at step 5. The semiconductor device is completed through these processes, and is shipped (step 7).

Figure 11:
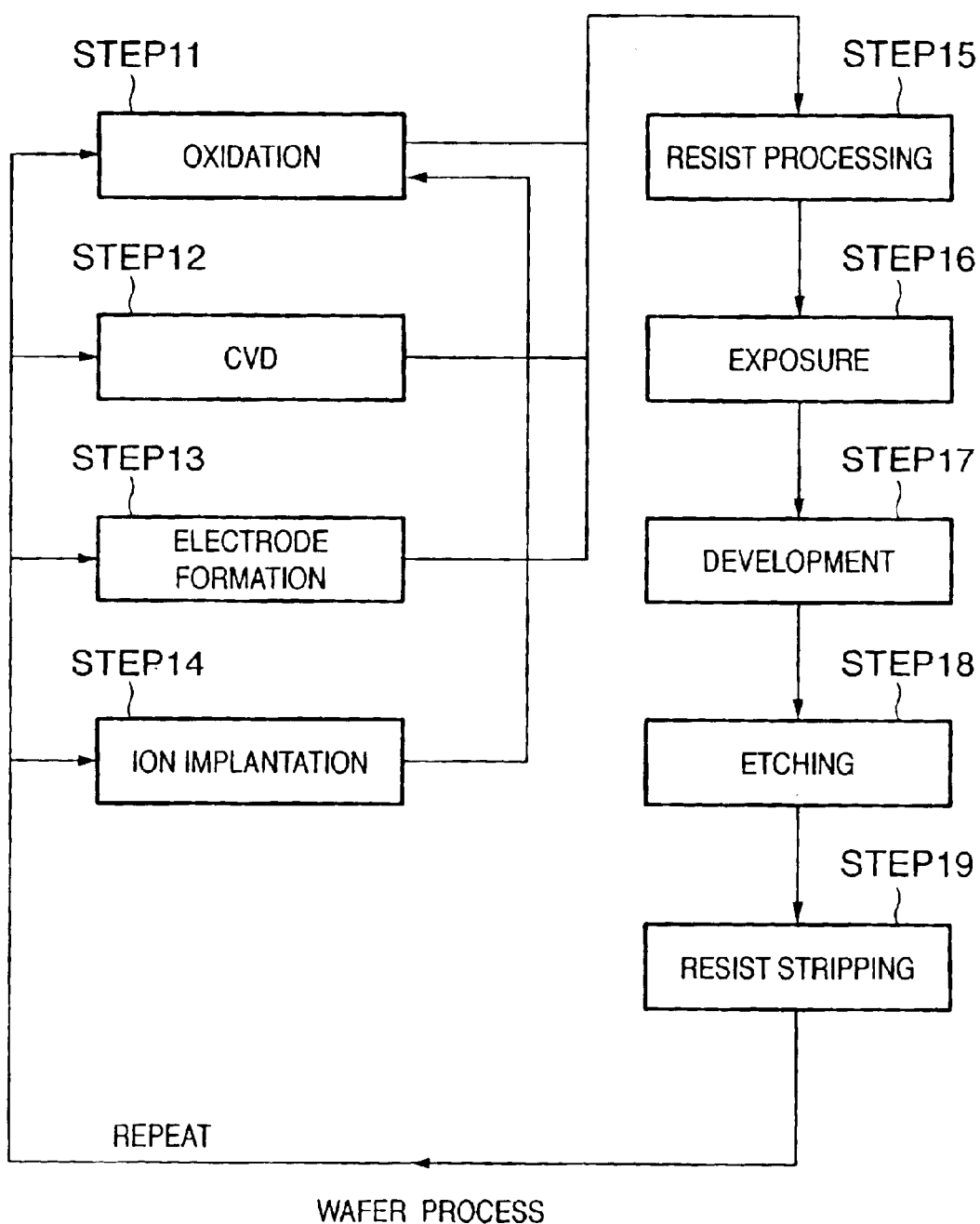
FIG. 11 is a flowchart showing the details of a wafer process in FIG. 10.

FIG. 11 shows the detailed flow of the wafer process (step 4). At step 11 (oxidation), the surface of the wafer is oxidized. At step 12 (CVD), an insulating film is formed on the surface of the wafer. At step 13 (electrode formation), electrodes are formed by vapor deposition on the wafer. At step 14 (ion implantation), ions are injected in the wafer. At step 15 (resist processing), the wafer is coated with photoresist. At step 16 (exposure), the mask circuit pattern is exposure-printed on the wafer by the above-described exposure apparatus. At step 17 (development), the exposed wafer is developed. At step 18 (etching), other portions than the developed resist are removed. At step 19 (resist stripping), the resist which is unnecessary after the completion of etching is removed. These steps are repeated, to form a multiple layers of circuit patterns on the wafer.

As described above, according to the present invention, the leak magnetic field is reduced by drive controlling the electromagnetic actuators, and the magnetic shield can be simplified and weight-reduced.

As many apparently widely different embodiments of the present invention can be made without departing from the spirit and scope thereof, it is to be understood that the invention is not limited to the specific embodiments thereof except as defined in the appended claims.

What is claimed is:

1. A stage apparatus, comprising:
   a first stage;
   plural electromagnet units that generate a moving force in a predetermined direction to said first stage by application of electric current to an exciting coil;
   application means for selectively applying the electric current to the exciting coil of said plural electromagnet units, based on a moving force and its direction to be applied to said first stage; and
   control means for, upon application of the electric current to the exciting coil by said application means, determining directions of the electric current to be applied to respective exciting coils so as to reduce a leak magnetic field around said first stage.

2. The stage apparatus according to claim 1, wherein said application means selects electromagnet units to be driven from said plural electromagnet units, and determines amounts of the electric current to be applied to the respective selected electromagnet units,
   and wherein said control means determines the directions of the electric current applied to the respective selected electromagnet units based on positions of the respective selected electromagnet units,
   further wherein the electric current is applied, in the determined amounts and in the determined direction, to the respective selected electromagnet units.

3. The stage apparatus according to claim 1, further comprising a second stage, holding said plural electromagnet units and said first stage, that moves within a plane,
   wherein said plural electromagnet units generate a moving force to said first stage, on said second stage.

4. The stage apparatus according to claim 3, wherein said application means selects electromagnet units to be driven based on a control signal to move said second stage.

5. A control method for a stage apparatus, having a first stage, plural electromagnet units that generate a moving force in a predetermined direction to said first stage by application of electric current to an exciting coil, comprising:
   an application step of selectively applying the electric current to the exciting coil of said plural electromagnet units, based on a moving force and its direction to be applied to said first stage; and a control step of, upon application of the electric current to the exciting coil by said application means, determining directions of the electric current to be applied to respective exciting coils so as to reduce a leak magnetic field around said first stage.

6. The control method according to claim 5, wherein at said application step, electromagnet units to be driven are selected from said plural electromagnet units, and the amounts of the electric current to be applied to the respective selected electromagnet units are determined, and wherein at said control step, the directions of the electric current applied to the respective selected electromagnet units are determined based on positions of the respective selected electromagnet units, further wherein the electric current is applied, in the determined amounts and in the determined directions, to the respective selected electromagnet units.

7. The method according to claim 5, wherein said stage apparatus further comprises a second stage, holding said plural electromagnet units and said first stage, that moves within a plane, and wherein at said application step, the moving force to be applied to said first stage and its direction are determined based on a control signal to move said second stage.

8. An exposure apparatus having the stage apparatus according to claim 1, which performs exposure processing on a photoresist substrate placed on said first stage.

9. A device manufacturing method including the step of performing exposure processing on a substrate using the exposure apparatus according to claim 8.

* * * * *

UNITED STATES PATENT AND TRADEMARK OFFICE
CERTIFICATE OF CORRECTION

PATENT NO. : 6,903,807 B2
DATED : June 7, 2005
INVENTOR(S) : Shinji Uchida

It is certified that error appears in the above-identified patent and that said Letters Patent is hereby corrected as shown below:

Column 4,
Line 16, "Numeral." should read -- Numeral --.

Column 11,
Line 22, "stages" should read -- stage --.

Column 12,
Line 12, "form a" should read -- form --.

Column 14,
Line 1, "The method" should read -- The control method --.

Signed and Sealed this

Eleventh Day of October, 2005

JON W. DUDAS
*Director of the United States Patent and Trademark Office*